(12) United States Patent
Hsu

(10) Patent No.: US 6,303,443 B1
(45) Date of Patent: Oct. 16, 2001

(54) METHOD OF FABRICATING SALICIDE IN ELECTROSTATIC DISCHARGE PROTECTION DEVICE

(75) Inventor: Shih-Ying Hsu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/668,642

(22) Filed: Sep. 21, 2000

(30) Foreign Application Priority Data

Aug. 21, 2000 (TW) .............................................. 089116895

(51) Int. Cl.⁷ .................................................. H01L 21/336
(52) U.S. Cl. .......................... 438/281; 438/432; 438/592
(58) Field of Search ................................... 438/281, 305, 438/592, 275, 279, 952

(56) References Cited

U.S. PATENT DOCUMENTS

| | | | |
|---|---|---|---|
| 4,877,755 | * | 10/1989 | Rodder . |
| 5,413,969 | * | 5/1995 | Huang . |
| 5,891,784 | * | 4/1999 | Cheung . |
| 5,933,739 | * | 8/1999 | Lin . |
| 5,946,573 | * | 8/1999 | Hsu . |
| 6,121,092 | * | 9/2000 | Liu . |
| 6,130,146 | * | 10/2000 | Chang et al. . |

* cited by examiner

Primary Examiner—Richard Booth
Assistant Examiner—Stacy Whitmore
(74) Attorney, Agent, or Firm—Thomas, Kayden, Horstemeyer & Risley, LLP

(57) ABSTRACT

A method of fabricating a salicide layer in an electrostatic discharge protection device. On a MOS transistor having a gate, a source region and a drain region, a salicide block layer is formed. The salicide layer is patterned to remaining covering the drain region only, and leaving the source region and other portions of the substrate exposed. The anti-reflection coating layer is then removed to expose the gate. A salicide layer is formed on the exposed source region, the gate and other exposed portion of the substrate, while the drain region is free from the salicide layer for being covered with the salicide block layer.

15 Claims, 4 Drawing Sheets

METHOD OF FABRICATING SALICIDE IN ELECTROSTATIC DISCHARGE PROTECTION DEVICE

CROSS-REFERENCE TO RELATED APPLICATION

This application claims the priority benefit of Taiwan application serial no. 89116895, filed Aug. 21, 2000.

BACKGROUND OF THE INVENTION

1. Field of the Invention

The invention relates in general to a method of fabricating an electrostatic discharge (ESD) protection device. More particularly, this invention relates to a method of fabricating a self-aligned silicide (salicide) layer in an electrostatic discharge protection device.

2. Description of the Related Art

In a conventional electrostatic discharge protection device, if a salicide layer is formed on the drain region thereof, the electrostatic current is easily localized to cause the junction to be locally burned and damaged. Once the junction is damaged, the protection function can never be achieved. To solve such problem, a method using salicide layer is provided and shown in FIG. 1A to FIG. 1C.

In FIG. 1A, on a substrate 100 having a shallow trench isolation 102, a gate 104, a source region 106a and a drain region 106b are formed. A salicide block layer 108 is formed to cover the gate 104, the source region 106a and the drain region 106b. A mask layer 110 is formed to cover the salicide block layer 108 on the drain region 106b. To ensure the salicide block layer 108 covering the drain region 106b is completely covered, it is often that the salicide block layer 108 is formed to cover a portion of the gate 104 next to the drain region 106b. Typically, according to the design rule, the width of the gate to be covered with the mask layer 110 is about 0.3 micron.

In FIG. 1B, the exposed salicide block 108 layer is removed to expose the source region 106a and a portion of the gate 104, while the drain region 106b is still covered with the remaining salicide block layer 108a. In FIG. 1C, a salicide layer 112 is formed on the exposed source region 106a and a portion of the gate 104. As shown in FIG. 1C, the drain region 106b is free from formation of the salicide layer 112 for being covered with the salicide block layer 108a. Therefore, when the device approaches a second breakdown, the ballast resistance of the drain region 106b prevents current localization, and thus, prevents the junction from being damaged thereby. However, as a portion of the gate 104 is also covered with the salicide block layer 108 while forming the salicide layer 112, the resistance of the gate 104 is thus remained at a certain high magnitude. As the integration of the integrated circuit increases, the line width of the gate consequently shrinks, the high resistance of the gate more and more seriously affects the electrical performance of the device.

In a typical conventional electrostatic discharge protection integrated circuit (IC), I/O driving transistors are connected with electrostatic discharge protection transistors in parallel. When electrostatic discharge occurs, the I/O driving transistors are switched to function as the electrostatic discharge protection transistors to share the electrostatic discharge current. Therefore, for these I/O driving transistors, in addition to protecting the junction from being damaged, it is also important to maintain the IC speed, such that the performance of the devices does not deteriorate. With the conventional method, since the salicide layer can only be formed on a portion of the gate, this requirement can hardly be met.

SUMMARY OF THE INVENTION

The invention provides a method of fabricating a salicide layer in an electrostatic discharge protection device. A MOS transistor comprising at least a gate, a drain region and a source region is provided. The gate is covered with an anti-reflection coating layer. A salicide block layer is formed to cover the source region and the drain region. The salicide block is patterned to expose the source region, while the drain region is still covered by the salicide block layer. The anti-reflection coating layer is removed to expose the gate after the salicide block layer is patterned. A salicide layer is then formed on the source region and the gate, while the drain region is free of formation of the salicide layer for being covered with the remaining salicide block layer.

In the method mentioned above, the drain region is covered with the salicide block layer while forming the salicide layer. Therefore, there is no salicide layer formed on the drain region. Current localization does not occur to damage the junction. In addition, with the anti-reflection coating layer, the salicide block layer is not formed on the gate. After the salicide block layer is patterned, the anti-reflection coating layer is removed to expose the whole gate. The gate surface is completely covered with the salicide layer. The resistance of the gate can thus be effectively reduced to ensure the required IC speed.

Both the foregoing general description and the following detailed description are exemplary and explanatory only and are not restrictive of the invention, as claimed.

DESCRIPTION OF THE PREFERRED EMBODIMENTS

Figure 1A:
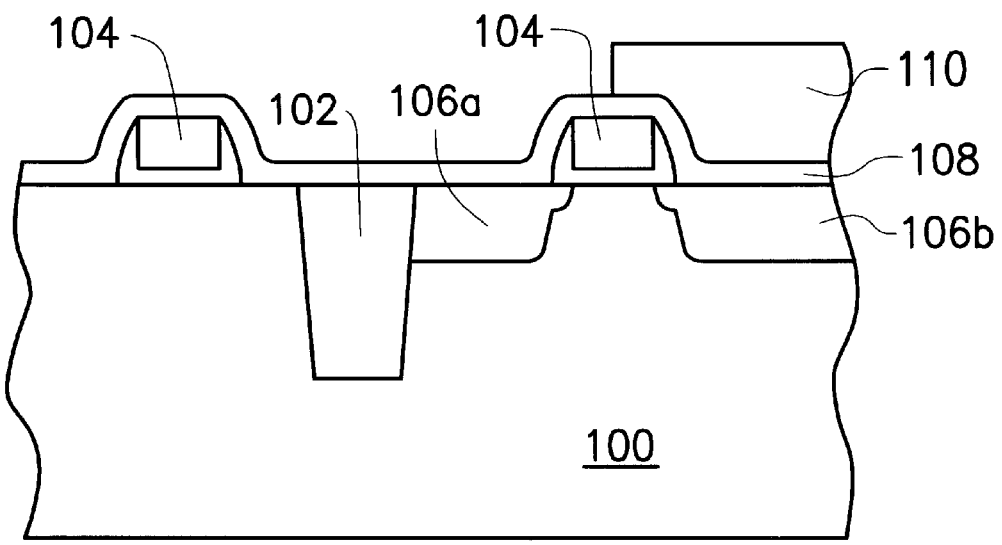
FIGS. 1A to 1C are cross sectional views showing a conventional method of fabricating an electrostatic discharge protection device.
Figure 1B:
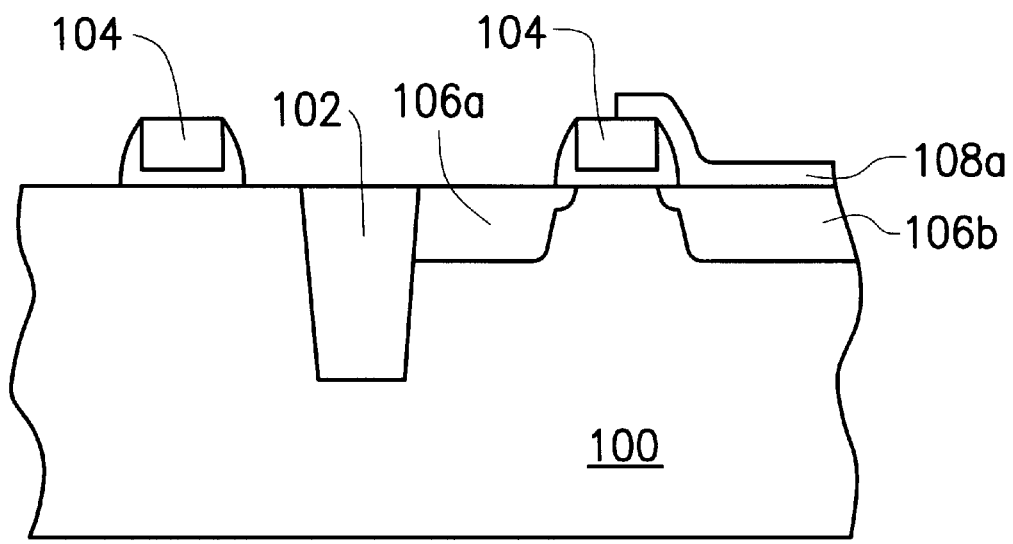
Figure 1C:
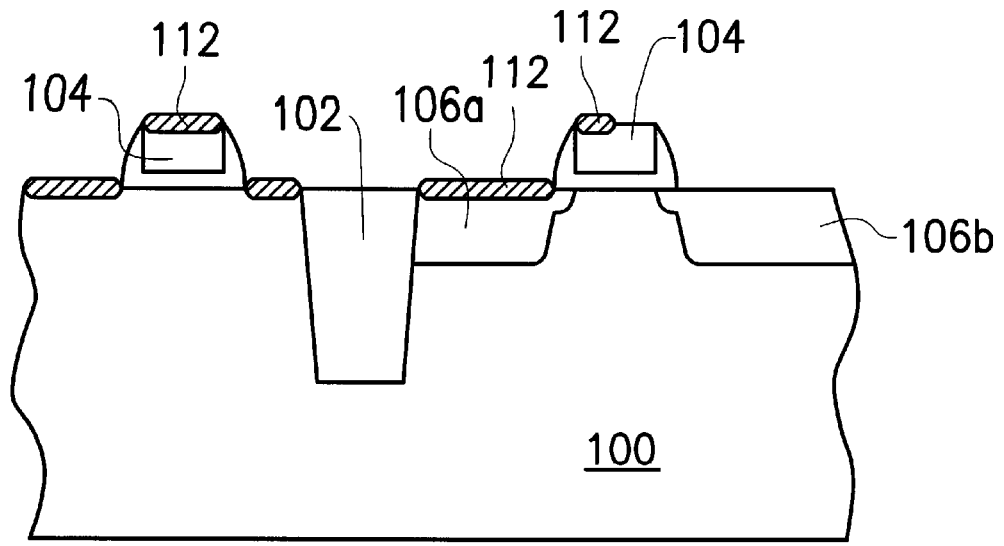
Figure 2:
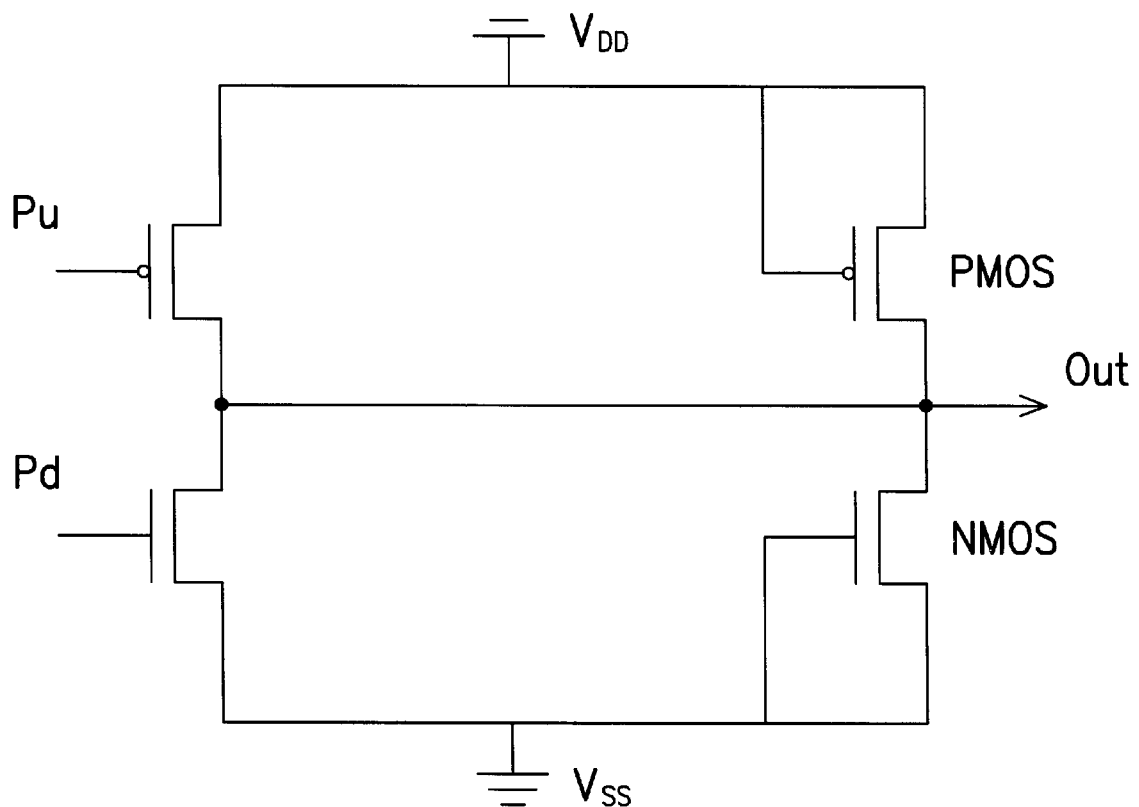
FIG. 2 shows a diagram of an electrostatic discharge protection integrated circuit.

In FIG. 2, an example of an electrostatic discharge protection circuit is shown. The circuit comprises pull-up (Pu) and pull-down (Pd) transistors connected with PMOS transistor and NMOS transistor in parallel. In the embodiment, a circuit comprising two PMOS transistors, two NMOS transistors, eight pull-up transistors and eight pull-down transistors is used as an example. In the circuit, the PMOS and NMOS transistors are used as electrostatic discharge protection devices, and the pull-up transistors and the pull-down transistors are used as I/O driving devices. In this embodiment, the PMOS transistors have a channel width-to-length ratio of, for example, about 28/1.1, while the NMOS transistors have a channel width-to-length ratio of, for example, about 28/1.4.

As shown in FIG. 2, when the circuit is operated, the pull-up transistors and the pull-down transistors are switched to connect with a buffer of an internal circuit as I/O driving devices to increase the driving circuit at the output denoted as Out. When electrostatic discharge occurs, the pull-up and pull-down transistors are switched to Vcc and Vss as electrostatic discharge protection devices. In this manner, there are ten parallel PMOS and ten parallel NMOS transistors used for electrostatic discharge protection to share the electrostatic discharge current. The PMOS and NMOS transistors for electrostatic discharge protection can thus bear with a high electrostatic discharge current without being damaged thereby. However, for the pull-up and pull-down transistors, to achieve the requirement of high IC speed when they are used as the I/O driving devices, the gate resistance has to be sufficiently low. In contrast, when the pull-up and pull-down transistors are used as the electrostatic discharge protection devices, the drain regions thereof have to be free of salicide layer to avoid current localization to damage the junction. Therefore, in the invention, a method to meet the above requirements with a wide process window is provided as shown in FIG. 3A to FIG. 3D.

Figure 3A:
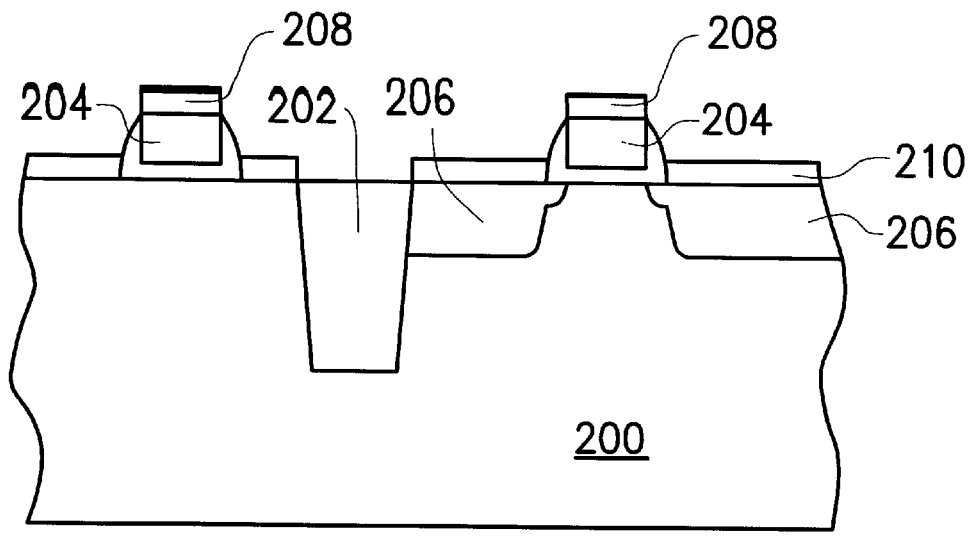
FIG. 3A to FIG. 3D are cross sectional views showing a method of fabricating an electrostatic discharge protection device according to the invention.

In FIG. 3A to FIG. 3D, a method of fabricating an electrostatic discharge protection device, including the above pull-up, pull-down, PMOS and NMOS transistors, is illustrated. In FIG. 3A, a substrate 200 comprising a shallow trench isolation 202 is provided. At least a MOS transistor used as an electrostatic discharge protection device is formed on the substrate 200. The MOS transistor comprises a gate 204, a source region 206a and a drain region 206b. The method of forming the gate 204 comprises forming a gate oxide layer and a conductive layer, preferably a polysilicon layer, on the substrate 200 in sequence. An anti-reflection coating layer (ARC) 208, for example, a nitride layer or a silicon oxy-nitride layer, is then formed on the conductive layer. The anti-reflection layer 208, the conductive layer and the gate oxide layer are patterned to expose the substrate 200 at two sides of the gate 204. After forming a lightly doping region at two sides of the gate 204, a pair of spacers are formed on two sidewalls of the gate 204. The substrate 200 is then heavily doped to form the source region 206a and the drain region 206b. A salicide block layer 210, preferably with a thickness of about 300 angstroms, is then formed over the substrate. For example, the salicide block layer 210 is formed by oxidation of the exposed substrate 200 including the source region 206a and the drain region 206b. The gate 204 is covered with the anti-reflection coating layer 208, and is thus free from being formed with the salicide block layer 210 thereon.

Figure 3B:
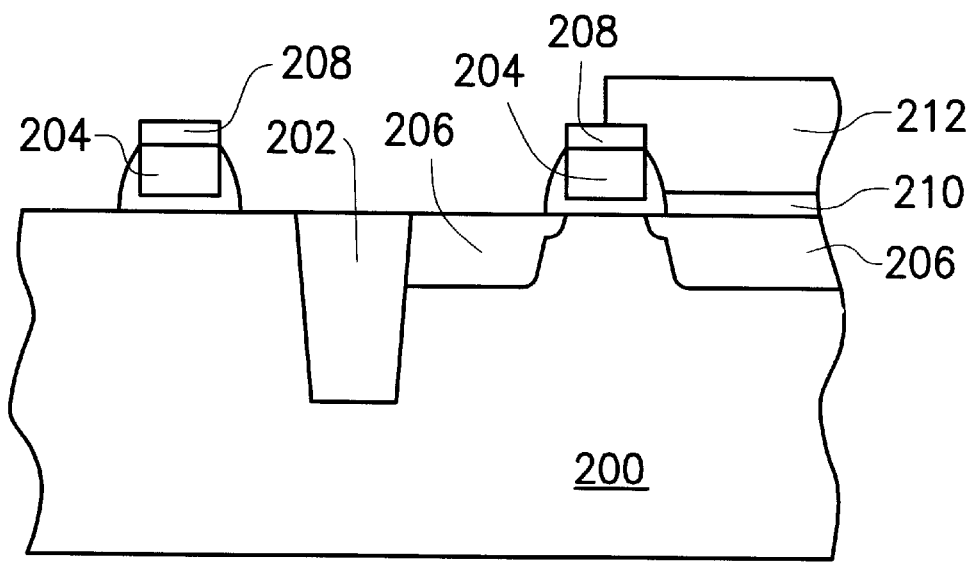

In FIG. 3B, a mask layer 212 is formed over the drain region 206b. That is, the salicide block layer 210 covering the drain region 206b is covered with the mask layer 212, while the salicide block layer 210 covering the source region 206a is exposed. The exposed salicide block layer 210 is then removed by, for example, dry etching or wet etching until the source region 206a is exposed.

Figure 3C:
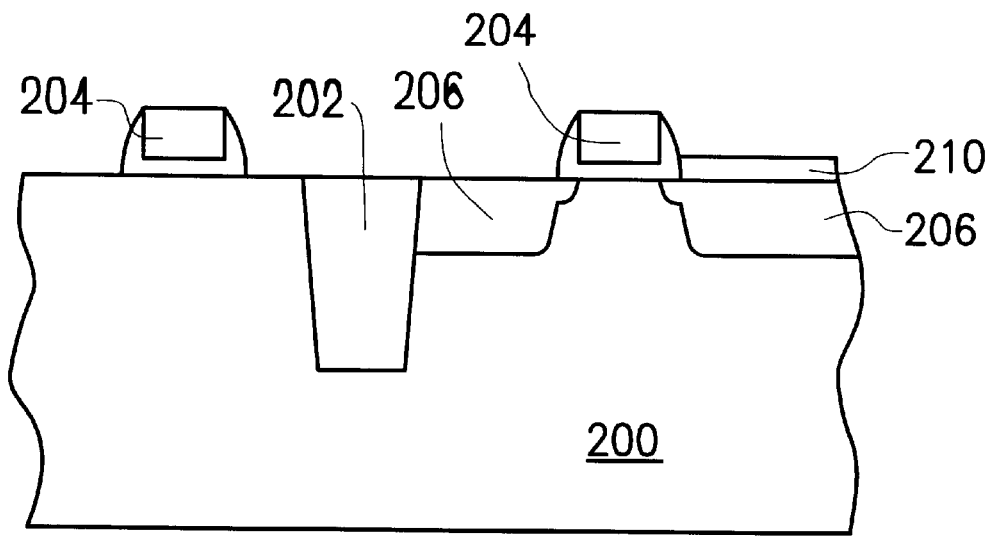

In FIG. 3C, the mask layer 212 is removed by, followed by the removal of the anti-reflection coating layer 208 by, for example, dipping the anti-reflection coating layer 208 in a hot phosphoric acid ($H_3PO_4$). Therefore, both the source region 206a and the gate 204 are exposed, while the drain region 206b is still covered with the salicide block layer 210.

Figure 3D:
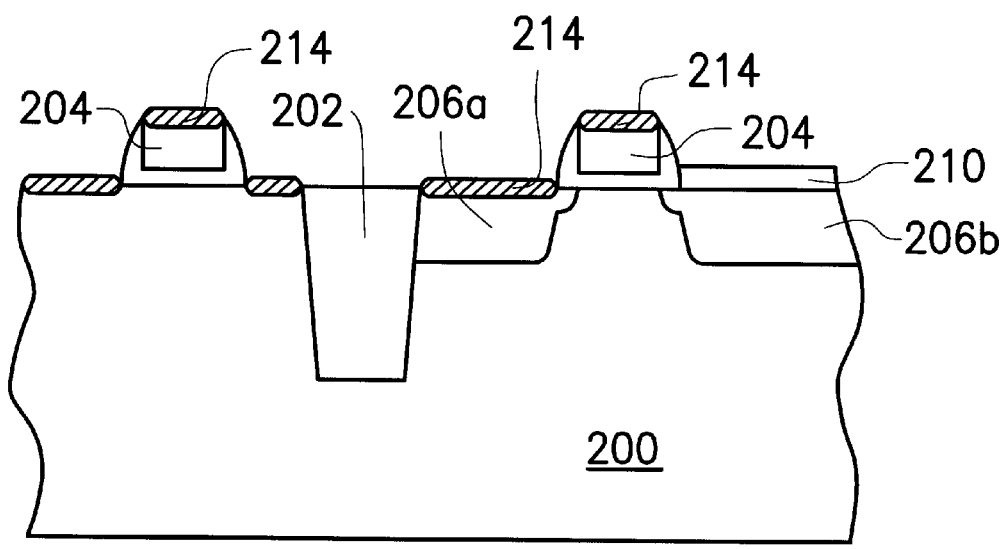

In FIG. 3D, a metal layer, for example, a refractory metal such as a titanium, tungsten and other metals, is formed over the substrate 200. By performing a thermal treatment, the metal layer is reacted with the underlying source region 206a and the gate 204 to form a salicide layer 214. Meanwhile, since the drain region 206b is covered with the salicide block layer 210 that obstruct the salicidation, so that there is no salicide layer to be formed on the drain region 206b. The remaining metal layer that is not reacted is then removed. As a result, as shown in FIG. 3D, the source region 206a and the whole gate 204 are covered with the salicide layer 214, while the drain region 206b is not covered with the salicide layer 214 at all. The requirements for having a ballast resistance in the drain region and a resistance low enough in the gate to maintain a high IC speed are thus met by using the method provided by the invention.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a salicide layer in an electrostatic discharge protection device, the method comprising:

providing a MOS transistor comprising at least a gate, a source region and a drain region, wherein the gate is covered with an anti-reflection coating layer;

forming a salicide block layer over the substrate;

patterning the salicide block layer to expose the source region, the remaining salicide block layer covering the drain region only;

removing the anti-reflection coating layer to expose the gate; and forming a salicide layer on the exposed gate and the exposed source region, while the drain region is free from being covered by the salicide layer because of being covered by the remaining salicide block layer.

2. The method according to claim 1, wherein the step of forming the anti-reflection coating layer includes a step of forming a silicon nitride layer.

3. The method according to claim 1, wherein the step of forming the anti-reflection coating layer includes a step of forming a silicon oxy-nitride layer.

4. The method according to claim 1, wherein the step of forming the salicide block layer includes performing a step of oxidizing the source region and the drain region.

5. The method according to claim 1, wherein the step of forming the salicide layer includes a step of forming an oxide layer on the source region and the drain region.

6. The method according to claim 1, wherein the step of forming the anti-reflection coating layer includes a step of forming an anti-reflection coating layer with a thickness of about 300 angstroms.

7. A method of fabricating an electrostatic discharge protection circuit, the method comprising:

providing a substrate;

forming a plurality of pull-up transistors and pull-down transistors connected with each other in parallel, each of the pull-up and the pull-down transistor comprises a gate, a source region and a drain region, wherein each gate is covered with an anti-reflection coating layer;

forming a plurality of electrostatic discharge protection transistors, each electrostatic discharge protection transistor comprising a gate, a source and a drain region, wherein the gate is covered with an anti-reflection coating layer;

forming a salicide block layer on the substrate;

forming a mask layer to cover the salicide block layer on all the drain regions, and leaving the salicide block layer on all the source regions and gate regions exposed;

etching the salicide block layer until all the source regions are exposed;

removing the mask layer;

removing the anti-reflection layer to expose each of the gates;

forming a salicide layer on each source region and each gate, while all the drain regions are prevented from being covered by the salicide layer because of being covered with the salicide block layer.

8. The method according to claim 7, wherein the step of forming a plurality of pull-up transistors comprises a step of forming a plurality of PMOS transistors.

9. The method according to claim 7, wherein the step of forming a plurality of pull-down transistors comprises a step of forming a plurality of NMOS transistors.

10. The method according to claim 7, wherein the step of forming the anti-reflection coating layer includes a step of forming a silicon nitride layer.

11. The method according to claim 7, wherein the step of forming the anti-reflection coating layer includes a step of forming a silicon oxy-nitride layer.

12. The method according to claim 7, wherein the step of forming the salicide block layer includes performing a step of oxidizing the source regions and the drain regions.

13. The method according to claim 7, wherein the step of forming the salicide layer includes a step of forming an oxide layer on the source regions and the drain regions.

14. The method according to claim 7, wherein the step of forming the anti-reflection coating layer includes a step of forming an anti-reflection coating layer with a thickness of about 300 angstroms.

15. The method according to claim 7, wherein the step of providing a plurality of electrostatic discharge protection transistors comprises a plurality of PMOS transistors and a plurality of NMOS transistors with an equal number of the PMOS transistors.

* * * * *